(12) United States Patent
Jou et al.

(10) Patent No.: US 7,639,801 B2
(45) Date of Patent: Dec. 29, 2009

(54) METHOD OF TRANSFORMING SERIAL SCRAMBLER TO PARALLEL SCRAMBLER, PARALLEL SCRAMBLER AND DOUBLE-EDGE-TRIGGERED REGISTER WITH XOR OPERATION

(75) Inventors: Shyh-Jye Jou, Jungli (TW); Chih-Ning Chen, Jungli (TW); You-Jiun Wang, Jungli (TW); Ju-Yuan Hsiao, Jungli (TW); Chih-Hsien Lin, Jungli (TW)

(73) Assignee: National Central University, Taoyuan (TW)

( * ) Notice: Subject to any disclaimer, the term of this patent is extended or adjusted under 35 U.S.C. 154(b) by 852 days.

(21) Appl. No.: 11/096,957

(22) Filed: Mar. 31, 2005

(65) Prior Publication Data
US 2006/0029225 A1    Feb. 9, 2006

(30) Foreign Application Priority Data
Aug. 9, 2004    (TW)    ................... 93123763

(51) Int. Cl.
*H04L 9/00*    (2006.01)
(52) U.S. Cl. ....................................... 380/37
(58) Field of Classification Search ............ 380/28, 380/37, 44, 45, 46, 47, 42, 286
See application file for complete search history.

(56) References Cited

U.S. PATENT DOCUMENTS

| 5,377,265 | A * | 12/1994 | Wettengel et al. | 380/268 |
|---|---|---|---|---|
| 7,092,979 | B1 * | 8/2006 | Shim | 708/250 |
| 7,139,344 | B2 * | 11/2006 | Crutchfield et al. | 375/354 |
| 7,308,104 | B1 * | 12/2007 | Kim et al. | 380/268 |
| 7,415,112 | B2 * | 8/2008 | Amer | 380/268 |
| 2002/0196861 | A1 * | 12/2002 | Tzannes et al. | 375/261 |
| 2002/0196884 | A1 * | 12/2002 | Crutchfield et al. | 375/355 |
| 2004/0202174 | A1 * | 10/2004 | Kim et al. | 370/395.1 |

\* cited by examiner

*Primary Examiner*—Beemnet W Dada
(74) *Attorney, Agent, or Firm*—J.C. Patents

(57) ABSTRACT

A method of transforming a serial scrambler to a parallel scrambler, a parallel scrambler and a double-edge-triggered register with XOR operation are provided. The method transforms a serial scrambler to a parallel scrambler according to a characteristic polynomial:

$$P(x) = \sum_{q=0}^{N} c_q x^q \text{ or } b(i) = \sum_{q=1}^{N} c_q b(i-q).$$

The method first determines a transformation formula:

$$b(kN+i) = \sum_{q=1}^{N} c_q b((k-R)N + i + R(N-q))$$

according to the parameters of the characteristic polynomial. The parallel bits $B_j = [b_{Mj}, b_{Mj+1}, \ldots, b_{Mj+M-2}, b_{Mj+M-1}]$ are arranged in order. The transformation number $R=2^t$ (the initial number of t is 0) is set. The parallel bits are replaced by the transformation formula. When $(k-R)N+i+R(N-q)$ is larger than $Mj-1$ in the transformation formula, 1 is added to t in the transformation formula $R=2^t$ and the transformation formula is re-counted. Finally, the XOR gates are connected to the registers according to a computed result from the transformation formula.

18 Claims, 7 Drawing Sheets

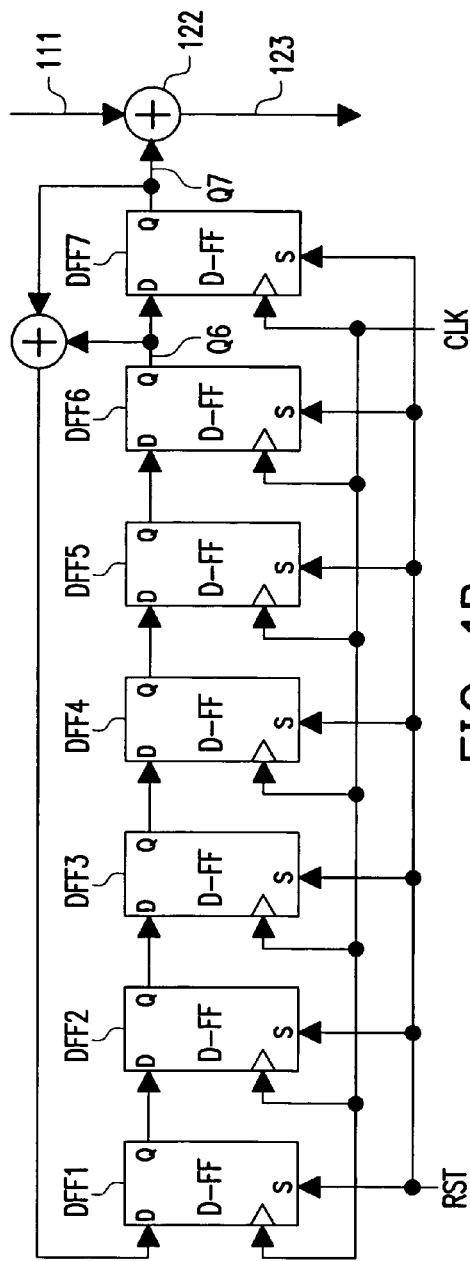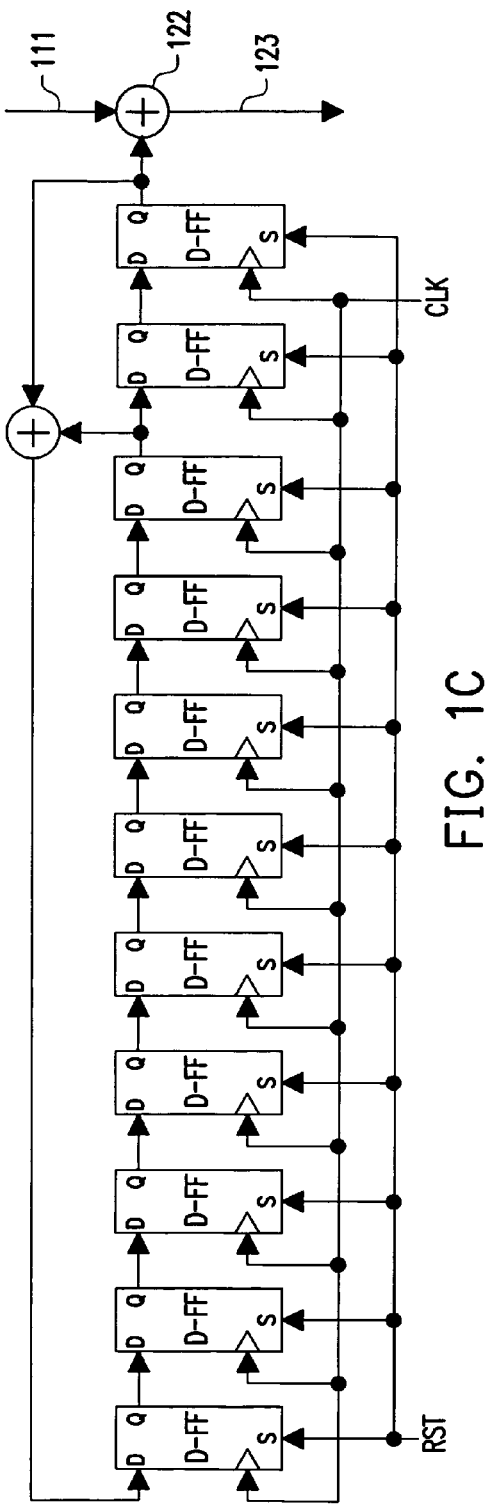
FIG. 1B
FIG. 1C

METHOD OF TRANSFORMING SERIAL SCRAMBLER TO PARALLEL SCRAMBLER, PARALLEL SCRAMBLER AND DOUBLE-EDGE-TRIGGERED REGISTER WITH XOR OPERATION

CROSS-REFERENCE TO RELATED APPLICATION

This application claims the priority benefit of Taiwan application Ser. No. 93123763, filed on Aug. 9, 2004.

BACKGROUND OF THE INVENTION

1. Field of the Invention

The present invention relates to a scrambler, and more particularly, to a parallel scrambler and a double-edge-triggered register thereof with XOR operation and a method of transforming a serial scrambler to a parallel scrambler.

2. Description of the Related Art

In the present Internet or transmission standard, such as IEEE 802.3ae or IEEE1394b, serial scramblers have been used to perform scrambling operations. FIG. 1A is a conventional transmission circuit. With reference to FIG. 1A, for a clear description, this configuration shows only the transmission part of the transmission circuit. The parallel data DATA are multiplexed into a serial data 111 by the parallel-in-serial-out circuit 110. The serial data 111 are scrambled by the serial scrambler 120 to generate the scrambled data 123. The encoder 130 further encodes the scrambled data 123, generating the encoded data 131. The transmitter 140 then transmits the data. Wherein, the serial scrambler 120 generates the serial scrambling codes by the scrambling code generator 121. The XOR gate 122 performs the XOR operation for the transmitted data and the scrambling codes.

The design of the scrambling code generator 121 varies with the transmission standards. FIG. 1B is a circuit block diagram showing a conventional IEEE 802.3ae serial scrambler. With reference to FIG. 1B, the scrambler consists D-type flip-flops, DFF1-DFF7, and xor gates. The sixth-stage output Q6 and the seventh-stage output Q7 connect to the XOR gate, the output of which fed back to the first-stage for generating the scrambling code. The scrambled data sequence is generated by the xor operation on scrambling code and input data. Accordingly, the characteristic polynomial can given by: $P(x) = X^7 + X^6 + 1$. Every bit can be represented as: $b_{(z)} = b_{(z-6)} \oplus b_{(z-7)}$, wherein Z=7,8,9... ∞ and $b_{(0)} \sim b_{(6)}$ are initial conditions.

FIG. 1C is a block diagram showing a conventional IEEE 1394b serial scrambler. With reference to FIG. 1C, except for the number of the shift registers, the structure is similar to that of IEEE 802.3ae serial scrambler. The characteristic polynomial is shown as: $P(x) = X^{11} + X^9 + 1$, in which the $11^{th}$ and $9^{th}$ outputs are connect to the XOR gate and generating the scrambling code.

It can be found in the structure of the serial scrambler that registers are important part of the circuit. Accordingly, the operational rate of the register has direct impact on the operational rate of the serial scrambler. Conventional registers use the single-edge-triggered mechanism. In such a mechanism, half a cycle is for storing data, and another half is used for triggering the stored data. In terms of efficiency, the single-edge-triggered mechanism wastes half a cycle for storing the data. In addition, the data rate needs to be as fast as the clock rate. If the register is operated at high speed, the clock rate should be as high. However, it is difficult to design such a clock circuit.

With the advance of semiconductor technology, the high operation speed of the circuit can be achieved. However, we cannot just rely on the advance of semiconductor technology. In addition, the circuits made by the advance semiconductor technology are so expensive that the manufacturing of such circuit is not cost-effective.

SUMMARY OF THE INVENTION

Accordingly, the present invention is directed to a method of transforming a serial scrambler to a parallel scrambler to resolve the barrier of operational rate of the serial scrambler and generate scrambling code, so the operational rate of the scrambler can be higher.

The present invention is also directed to a parallel scrambler for achieving the object described above. The parallel circuit is designed to meet the high rate transmission of the scrambler.

The present invention is also directed to an XOR double-edge-triggered register. By integrating the double-edge-triggered $C^2$MOS register and the exclusive-OR gate (XOR Gate), the transmission rate of the circuit can be substantially upgraded.

The present invention provides a method of transforming a serial scrambler to a parallel scrambler with M-bit output. The parallel scrambler comprises a plurality of XOR gates and registers. An output of each of the XOR gates is connected to an input of one of the registers. The serial scrambler has a characteristic polynomial:

$$P(x) = \sum_{q=0}^{N} c_q x^q,$$

wherein N represents a total stage of the registers of the serial scrambler. When an output of a $q^{th}$-stage register is connected to the XOR gates, $c_q=1$ or $c_q=0$. The number of the input connected to the XOR gates is S. The method of transforming the serial scrambler to the parallel scrambler comprises the step of setting a transformation number R, wherein $R=2^t$, and t is an integer equal to or larger than 0 and has an initial condition 0. A transformation formula according to the characteristic polynomial is given by:

$$b_{(kN+i)} = \sum_{q=1}^{N} c_q b_{((k-R)N+i+R(N-q))}.$$

Then the parallel bits are arranged to a byte as: $B_j = [b_{Mj}, b_{Mj+1}, \ldots, b_{Mj+M-2}, b_{Mj+M-1}]$, wherein the $b_{Mj+p}$ represents an output of a $p^{th}$ bit of a $j^{th}$ byte from the parallel scrambler, and the $b_{Mj+p}$ is generated from an output of one of the registers, wherein k is a quotient of $$\frac{Mj+p}{N},$$

i is a remainder of $$\frac{Mj+p}{N},$$

j is an integer larger than or equal to 0, and p is an integer larger than or equal to 0 and smaller than M. The transformation formula is operated. When (k−R)N+i+R(N−q) is larger than Mj−1, 1 is added to t in R=$2^t$ and the transformation formula is re-counted. A connection relationship between the XOR gates and the registers is determined according to a computed result from the transformation formula. According to the method of transforming a serial scrambler to a parallel scrambler in an embodiment of the present invention, the method further comprises the step of setting the initial conditions of $b_1$ to $b_N$, wherein the initial conditions of $b_1$ to $b_N$ can be 1.

According to the method of transforming a serial scrambler to a parallel scrambler in an embodiment of the present invention, the method further comprises the step of determining a number of the register or XOR gates. Determination of the number of the register comprises the following steps. First, the number of the parallel bits is set as M, when M is larger than $M_{min}$ and small than $M_{max}$, and R is larger than 1, wherein $$M_{max} = (N-D)R, \quad M_{min} = \frac{(N+D) \cdot R}{2},$$

and D represents a difference between the maximum and the minimum of q when $c_q$=1. When M is between $M_{min}$ and $M_{max}$, the number of the registers is M. When $M_{min}$ is larger than $M_{max}$, the number of the registers is W. When M is smaller than $M_{max}$ and R is equal to 1, the number of the registers is N; if not, the number of the registers is W. Wherein, when 2M>R'·N, then W=R'·N; if not, W=[R'·N−(R'·N mod M)], wherein $$R' = 2^{\lceil \log_2 \frac{M}{N-D} \rceil}.$$

The method of determining the number of the XOR gates comprises the following steps. When the transformation number R is powers of 2, each of the xor gates register requires S−1 number of two input XOR gates. If not, the input number of the XOR gates must be larger than 2. When S is larger than 2, the number of the input of the XOR gates must be larger than or equal to 3.

The present invention discloses a parallel scrambler, which comprises a scrambling code generator and a plurality of XOR gates. The scrambling code generator generates a parallel scrambling code. The scrambling code generator comprises a plurality of XOR registers. Each of the XOR registers comprises a plurality of input and a scrambling output to separately operate an XOR operation and register signals received by the input to separately generate one bit corresponding to the parallel scrambling code. A first receiving input of each of the XOR gates is connected to one of the scrambling output corresponding thereto. A second receiving input of each of the XOR gates receives one bit corresponding to an original data. An output of each of the XOR gates outputs one bit of a scrambling code.

The present invention also provides an XOR double-edge-triggered register, which comprises an XOR circuit, a first to a sixth P-type transistors and a first to a sixth N-type transistors. The XOR circuit comprises a first input, a second input and an XOR output. A first source/drain of the first P-type transistor is connected to the XOR output, and a gate of the first P-type transistor is connected to a first clock signal. A source of the second P-type transistor is connected to a first voltage, and a gate of the second P-type transistor is connected to a second source/drain of the first P-type transistor. A source of the third P-type transistor is connected to a drain of the second P-type transistor, and a gate of the third P-type transistor is connected to a second clock signal. A first source/drain of the fourth P-type transistor is connected to the XOR output, and a gate of the fourth P-type transistor is connected to the second clock signal. A source of the fifth P-type transistor is connected to the first voltage, and a gate of the fifth P-type transistor is connected to a second source/drain of the fourth P-type transistor. A source of the sixth P-type transistor is connected a drain of the fifth P-type transistor, and a gate of the sixth P-type transistor is connected to the first clock signal. A first source/drain of the first N-type transistor is connected to the second source/drain of the first P-type transistor, a second source/drain of the first N-type transistor is connected to the XOR output, and a gate of the first N-type transistor is connected to the second clock. A drain of the second N-type transistor is connected to the drain of the third P-type transistor, and a gate of the second N-type transistor is connected to the first clock signal. A drain of the third N-type transistor is connected to a source of the second N-type transistor, a source of the third N-type transistor is connected to a second voltage, and a gate of the third N-type transistor is connected to the second source/drain of the first P-type transistor. A first source/drain of the fourth N-type transistor is connected to a second source/drain of the fourth P-type transistor, a second source/drain of the fourth N-type transistor is connected to the XOR output, and a gate of the fourth N-type transistor is connected to the first clock signal. A drain of the fifth N-type transistor is connected to the drain of the sixth P-type transistor, and a gate of the fifth N-type transistor is connected to the second clock signal. A drain of the sixth N-type transistor is connected to a source of the fifth N-type transistor, a source of the sixth N-type transistor is connected to the second voltage, and a gate of the sixth N-type transistor is connected to the second source/drain of the fourth P-type transistor.

According to the XOR double-edge-triggered register in an embodiment of the present invention, the XOR circuit comprises a transmission gate, a seventh P-type transistor, a seventh N-type transistor and a NOT gate. The transmission gate comprises a first gate, a second gate, a first connecting input and a first connecting output. The first connecting input of the transmission gate is the input. The first connecting output of the transmission gate is the output of the XOR circuit. The second gate of the transmission gate is the second input. A first source/drain of the seventh P-type transistor is connected to the first gate of the transmission gate, the second source/drain of the seventh P-type transistor is connected to the first connecting output of the transmission gate, and a gate of the seventh P-type transistor is connected to the first connecting input of the transmission gate. A first source/drain of the seventh N-type transistor is connected to the first connecting output of the transmission gate, a second source/drain of the seventh N-type transistor is connected to the second gate of the transmission gate, and a gate of the seventh N-type transistor is connected to the first connecting input of the transmission gate. An input of the NOT gate is connected to the second gate of the transmission gate, and an output of the NOT gate is connected to the first gate of the transmission gate.

According to the XOR double-edge-triggered register in an embodiment of the present invention, the register further comprises an eighth N-type transistor and a ninth N-type transistor. A first source/drain of the eighth N-type transistor is connected to the second source/drain of the first P-type transistor, a second source/drain of the eighth N-type transistor is connected to the second voltage, and a gate of the eighth N-type transistor is connected to a preset signal. A first source/drain of the ninth N-type transistor is connected to the second source/drain of the fourth P-type transistor, a second source/drain of the ninth N-type transistor is connected to the second voltage, and a gate of the ninth N-type transistor is connected to the preset signal.

According to the XOR double-edge-triggered register in an embodiment of the present invention, the first clock signal is reverse to the second clock signal. In addition, the first voltage can be a system source voltage, and the second voltage can be a ground voltage.

Because the present invention uses a design and structure of a parallel scrambler, the limitation of the operational rate in the serial scrambler can be overcome. By generating scrambling code, the operational rate of the scrambler can be enhanced. Accordingly, the parallel scrambler can parallel output data according to the requirement of high transmission rate. By integrating the double-edge-triggered $C^2$MOS register and the exclusive-OR gate (XOR Gate), the transmission rate of the circuit can be substantially enhanced.

The above and other features of the present invention will be better understood from the following detailed description of the embodiments of the invention that is provided in combination with the accompanying drawings.

BRIEF DESCRIPTION OF THE DRAWINGS

FIG. 1B is a circuit block diagram showing a conventional IEEE 802.3ae serial scrambler.

FIG. 1C is a block diagram showing a conventional IEEE 1394b serial scrambler.

DESCRIPTION OF THE EMBODIMENTS

Figure 2A:
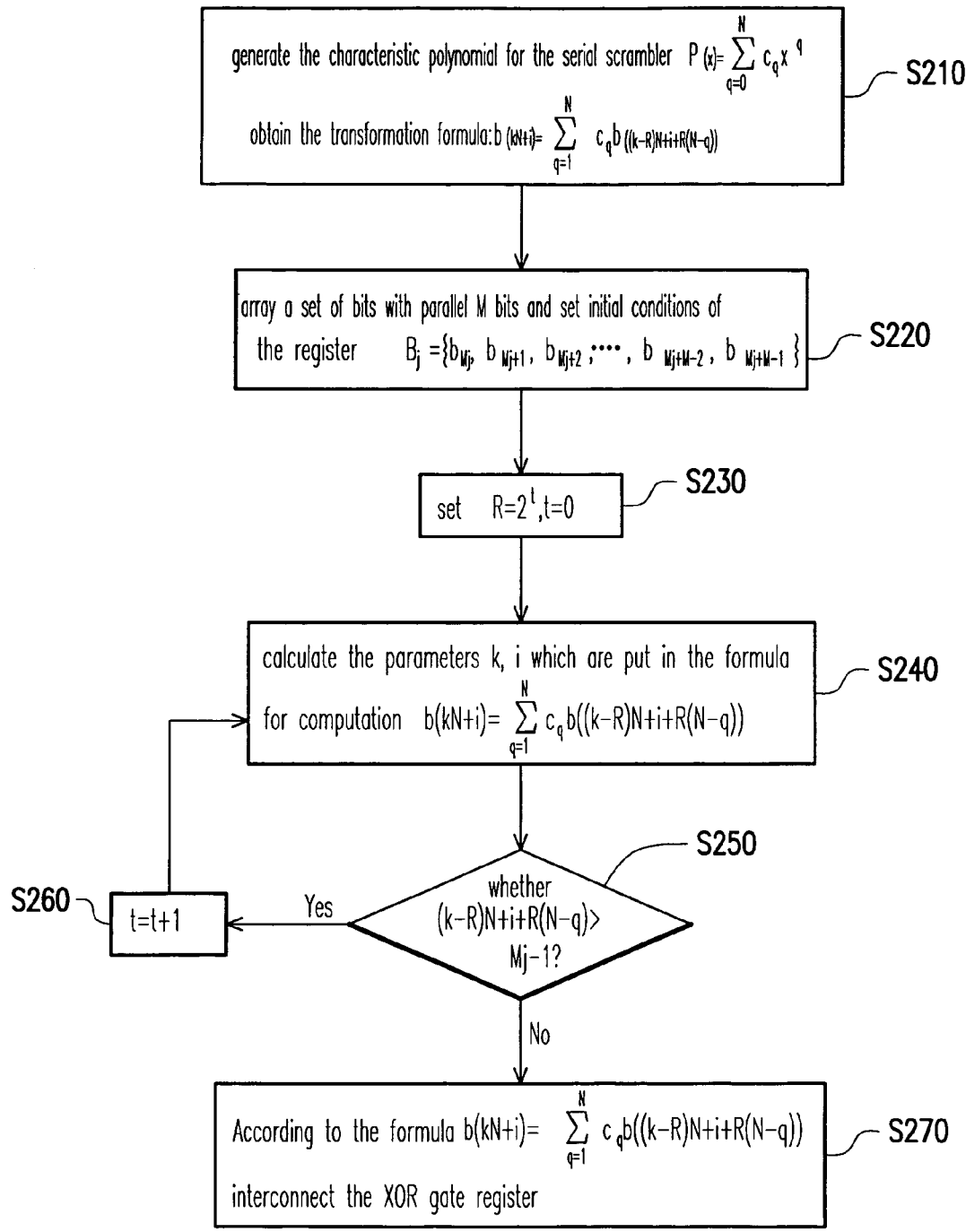
FIG. 2A is a flowchart showing a method of transforming a serial scrambler to a parallel scrambler according to an embodiment of the present invention.

What follows is the description of a method of transforming a serial scrambler to a parallel scrambler according to one embodiment of the present invention. By transforming a one-bit output of a clock signal generated from a serial scrambler into an M-bit output of a clock signal, the parallel scrambler can output the same data generated by the serial scrambler. With the parallel structure, the parallel scrambler can parallel perform encoding operation for the input data. The parallel-encoded data are then transmitted to a multiplexer for serial output. Accordingly, the transmission rate is enhanced. FIG. 2A is a flowchart showing a method of transforming a serial scrambler to a parallel scrambler according to an embodiment of the present invention.

With reference to FIG. 2A, the step S210 generates the characteristic polynomial for the serial scrambler:

$$P(x) = \sum_{q=0}^{N} c_q x^q.$$

Figure 1A:
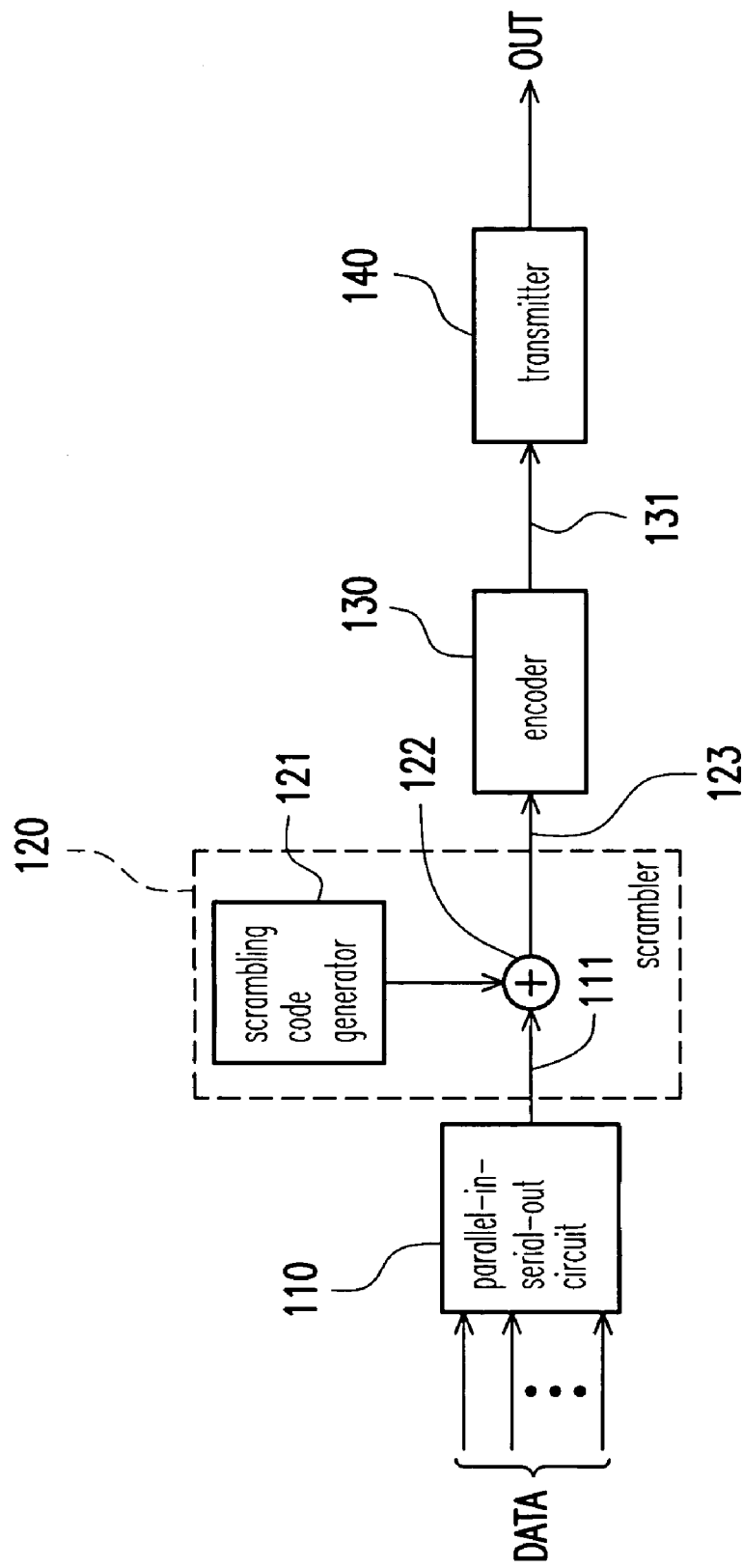
FIG. 1A is a conventional transmission circuit.

In this embodiment, the serial scrambler can be, for example, a IEEE 802.3ae serial scrambler as shown in FIG. 1B. Accordingly, the characteristic polynomial for the IEEE 802.3ae serial scrambler is: $X^7+X^6+1$. That is, N=7, $C_7=C_6=C_0=1$, and the other $C_q=0$. According to the characteristic polynomial, the transformation formula is given by:

$$b_{(7k+i)} = \sum_{q=1}^{7} c_q b_{(7(k-R)+i+R(7-q))}.$$

One of ordinary skill in the art, after reading the descriptions of this embodiment, can transform any type of serial scrambler to the parallel scrambler. All of these amendments fall within the scope of the invention. In other words, the present invention is not limited to the IEEE 802.3ae serial scrambler.

In the step S220, a byte with parallel M bits are arranged in order and initial conditions are set corresponding thereto. In this embodiment, M can be 16, and the bytes are shown as:

$B_0=\{b_0, b_1, b_2, \ldots, b_{14}, b_{15}\}$ $B_1=\{b_{16}, b_{17}, b_{18}, \ldots, b_{30}, b_{31}\}$ $B_2=\{b_{32}, b_{33}, b_{34}, \ldots, b_{46}, b_{47}\}$ $B_j=\{b_{16j}, b_{16j+1}, b_{16j+2}, \ldots, b_{16j+14}, b_{16j+15}\}$ In the step S230, the transformation number is set as R, wherein $R=2^t$, and the initial condition of t is 0. $b_{16j+p}$ represents an output of the $p^{th}$ bit of the $j^{th}$ byte from the parallel scrambler, wherein j is an integer larger than or equal to 0, p is an integer larger than or equal to 0 and smaller than M, k is a quotient of $$\frac{Mj+p}{N},$$

and i is a remainder of $$\frac{Mj+p}{N}.$$

In the step S240, the transformation formula $$b_{(7k+i)} = \sum_{q=1}^{7} c_q b_{(7(k-R)+i+R(7-q))} \quad 5$$

is operated for each output bit. Accordingly, the transformation formula is expressed as: $b_{(7k+i)}=b_{7(k-R)+i}\oplus b_{7(k-R)+(i+R)}$. Then every bit is transformed. For example, the bit $b_{16}$ is outputted from the $P_0$ output by processing the byte $B_1$ of the parallel scrambler to generate the result: k=2; and i=2. Accordingly, the transformation formula is given by: $b_{(7*2+2)}=b_{7(2-1)+2}\oplus b_{7(2-1)+(2+1)}$. That is, $b_{16}=b_9\oplus b_{10}$. For example, the byte $B_1$ is shown as:

$B_1=[b_9+b_{10}, b_{10}+b_{11}, b_{11}+b_{12}, b_{12}+b_{13}, b_{13}+b_{14}, b_{14}+b_{15},$
$b_{15}+b_{16}, b_{16}+b_{17}, b_{17}+b_{18}, b_{18}+b_{19}, b_{19}+b_{20}, b_{20}+b_{21},$
$b_{21}+b_{22}, b_{22}+b_{23}, b_{23}+b_{24}, b_{24}+b_{25}]$

The step S250 determines whether 7(k−R)+i+R(7−q) in the transformation formula $$b(7k+i) = \sum_{q=1}^{7} c_q b(7(k-R)+i+R(7-q))$$

is larger than 16j−1. If yes, the step S260 adds 1 to t in R=$2^t$ to re-count the transformation formula for the output bits. Accordingly, the result of the byte $B_1$ is shown as:

$B_1=[b_9+b_{10}, b_{10}+b_{11}, b_{11}+b_{12}, b_{12}+b_{13}, b_{13}+b_{14}, b_{14}+b_{15},$
$b_8+b_{10}, b_9+b_{11}, b_{10}+b_{12}, b_{11}+b_{13}, b_{12}+b_{14}, b_{13}+b_{15},$
$b_0+b_4, b_1+b_5, b_2+b_6, b_3+b_7]$

Figure 2B:
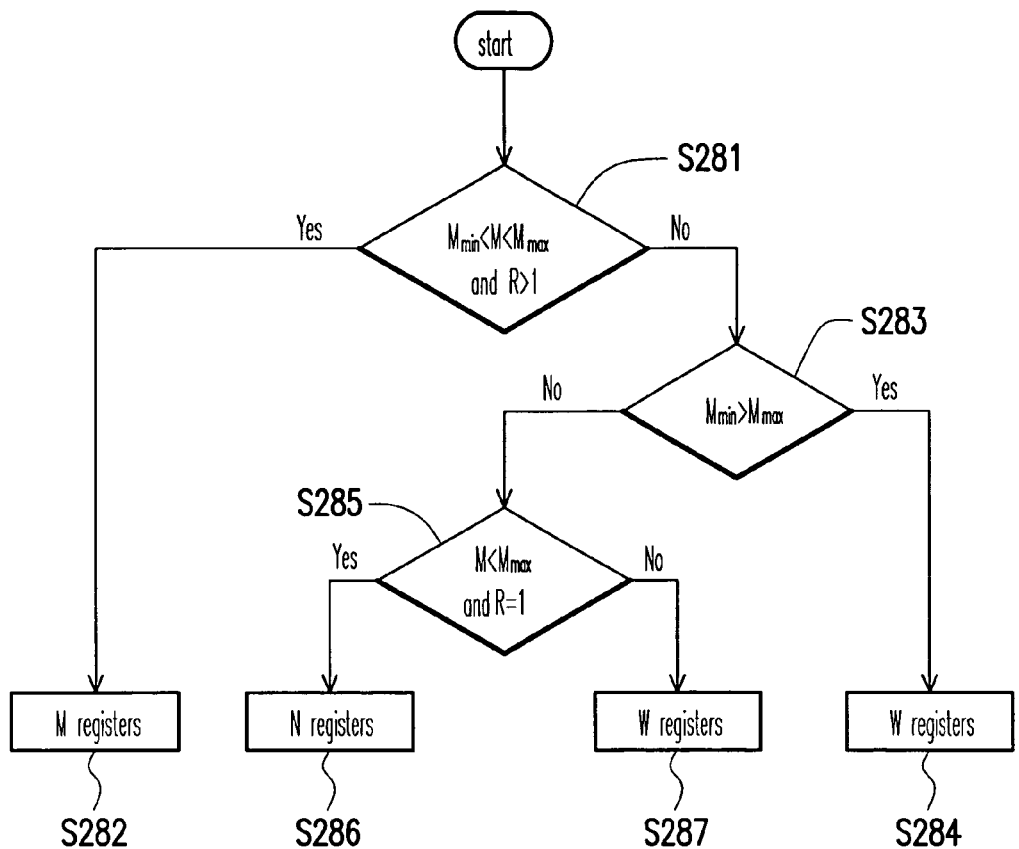
FIG. 2B is a flowchart showing a method of determining the number of the registers of the parallel scrambler according to an embodiment of the present invention.

If the determination in step S250 is no, the step S270 outputs the transformation formula of the bit $b_{(7k+i)}$. Accordingly, the transformed bytes are shown as:
$B_0=\{b_0, b_1, b_2, \ldots, b_{14}, b_{15}\}$
$B_1=\{b_9\oplus b_{10}, b_{10}\oplus b_{11}, b_{11}\oplus b_{12}, \ldots, b_2\oplus b_6, b_3\oplus b_7\}$
$B_2=\{b_{25}\oplus b_{26}, b_{26}\oplus b_{27}, b_{27}\oplus b_{28}, \ldots, b_{18}\oplus b_{22}, b_{19}\oplus b_{23}\}$ If $B_0$ is the initial condition, the relationship between the output ports and the inputs is shown as:
$\{P_0, P_1, P_2, \ldots, P_{14}, P_{15}\}=B_1=\{b_9\oplus b_{10}, b_{10}\oplus b_{11}, b_{11}\oplus b_{12}, \ldots, b_2\oplus b_6, b_3\oplus b_7\}$ In this embodiment, the method of determining the number of the registers of the parallel scrambler is shown in FIG. 2B. FIG. 2B is a flowchart showing a method of determining the number of the registers of the parallel scrambler according to an embodiment of the present invention. In the step S281, if $M_{min}<M<M_{max}$ and R>1, the number of the registers of parallel scrambler is M as shown in the step S282. That is, each of the output ports requires only one register, wherein $M_{max}=(N-D)\cdot R$ and $$M_{min} = \frac{(N+D)\cdot R}{2}.$$

If not, the step S283 is performed. The step S283 determines whether $M_{max}<M_{min}$. If yes, the number of the registers of the parallel scrambler is W as shown in the step S284. That is, some output ports need more than one register. If not, the step S285 is performed. The step S285 determines whether $M<M_{max}$ and R=1. If yes, the number of the registers of the parallel scrambler is N as shown in the step S286. If not, the number of the registers of the parallel scrambler is W as shown in the step S287. Wherein, if $2M>R'\cdot N$, then $W=R'\cdot N$; if not, $W=[R'\cdot N-(R'\cdot N \bmod M)]$, wherein $$R' = 2^{\lceil \log_2 \frac{M}{N-D} \rceil}.$$

Based on the parameters $M_{max}$, $M_{min}$ and R, the number of the registers must be larger than or equal to the output bits M of the parallel scrambler. In this embodiment, these registers are evenly assigned to the output bits. For example, if M=8, the number of the registers is 10. Then each of the output ports $P_0$ and $P_1$ consists two registers. Each of the other output ports $P_2$-$P_7$ consists one register.

Figure 2C:
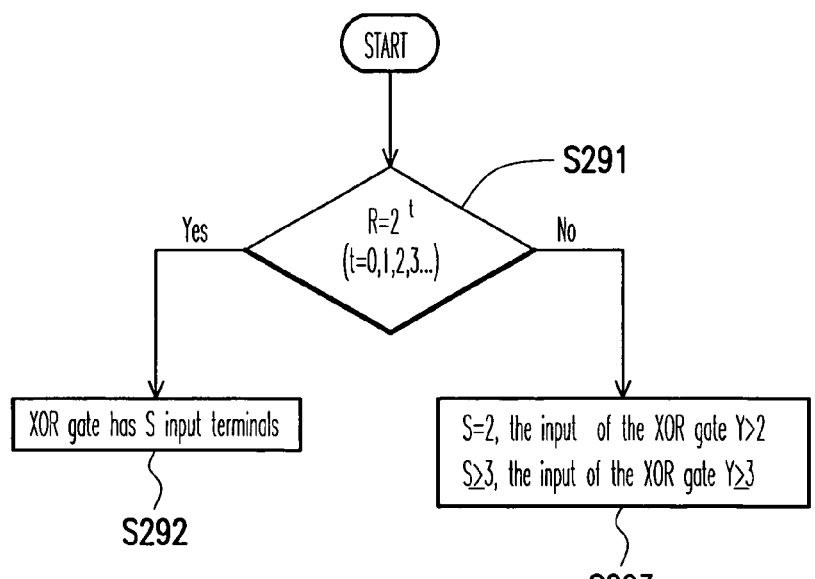
FIG. 2C is a flowchart showing a method of determining the number of input of the XOR gates of the parallel scrambler according to an embodiment of the present invention.

FIG. 2C is a flowchart showing a method of determining the number of input of the XOR gates of the parallel scrambler according to an embodiment of the present invention. S represents the number of the registers of the serial scrambler which are connected to the input of the XOR gates. If R is powers of 2 as shown in the step S291, each of the output ports only requires S−1 number of two input XOR gates as shown in the step S292. It means that S inputs are connected to the XOR gates. If R is not powers of 2, and S=2 the number of input of the XOR gates of the parallel scrambler must be larger than 2. When S>2, the number of input of the XOR gates of the parallel scrambler must be larger than or equal to 3 as shown in the step S293.

Figure 3:
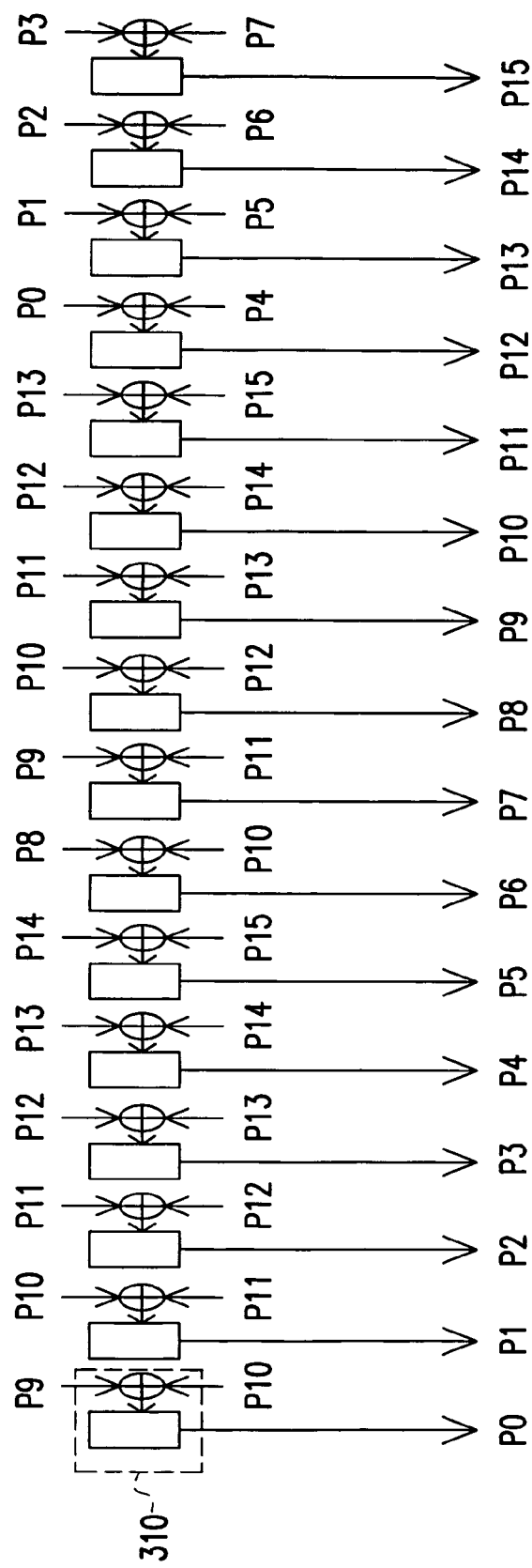
FIG. 3 is a schematic circuit block diagram showing a partial IEEE 802.3ae parallel scrambler according to an embodiment of the present invention.

In this embodiment, $P_p$ and the connecting relationship thereof are shown in Table 1 and FIG. 3. FIG. 3 is a schematic circuit block diagram showing a partial IEEE 802.3ae parallel scrambler according to an embodiment of the present invention.

TABLE 1

Figure 4:
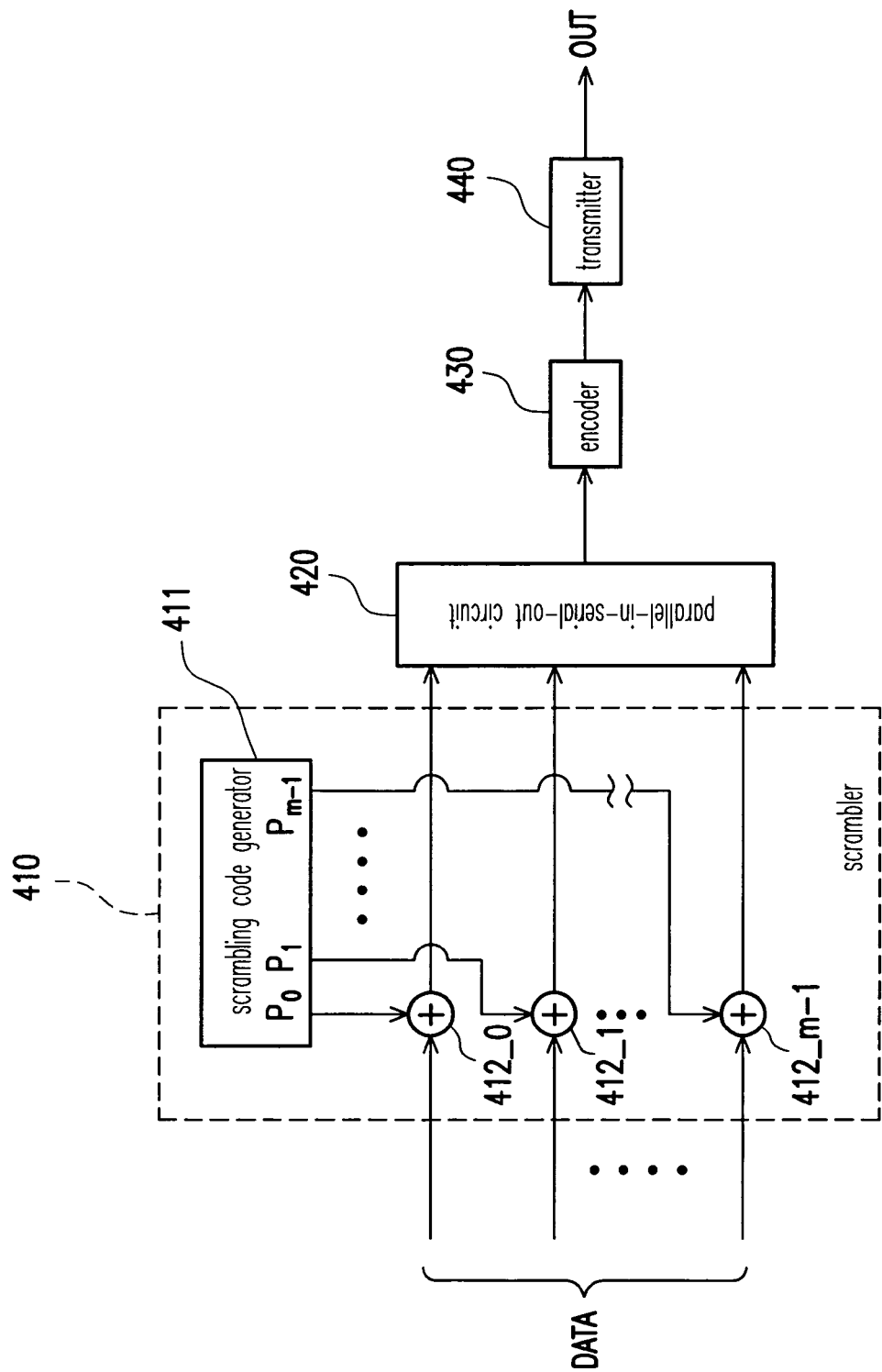
FIG. 4 is a schematic circuit block diagram showing a parallel scrambler according to an embodiment of the present invention.

$P_0 = P_9 \oplus P_{10}$
$P_1 = P_{10} \oplus P_{11}$
$P_2 = P_{11} \oplus P_{12}$
$P_3 = P_{12} \oplus P_{13}$
$P_4 = P_{13} \oplus P_{14}$
$P_5 = P_{14} \oplus P_{15}$
$P_6 = P_8 \oplus P_{10}$
$P_7 = P_9 \oplus P_{11}$
$P_8 = P_{10} \oplus P_{12}$
$P_9 = P_{11} \oplus P_{13}$
$P_{10} = P_{12} \oplus P_{14}$
$P_{11} = P_{13} \oplus P_{15}$
$P_{12} = P_0 \oplus P_4$
$P_{13} = P_1 \oplus P_5$
$P_{14} = P_2 \oplus P_6$
$P_{15} = P_3 \oplus P_7$ What follows is the description of an exemplary parallel scrambler according to the present invention. FIG. 4 is a schematic circuit block diagram showing a parallel scrambler according to an embodiment of the present invention. With reference to FIG. 4, for a clear description, the configuration shows only the transmission part of the parallel scrambler. The parallel scrambler 410 receives and scrambles the data DATA. The scrambled parallel data are then multiplexed into a serial data by the parallel-in-serial-out circuit 420. The serial data are then encoded and transmitted by the encoder 430 and the transmitter 440, and the output data OUT are then generated. The parallel scrambler 410 generates the scrambling codes by the scrambling code generator 411. The XOR gates 412_0 to 412_m−1 perform an XOR operation for one bit of the transmitted data and one of the scrambling codes corresponding thereto.

The designs of the scrambling code generator 411 vary with different transmission standards. For example, the scrambling code generator of the IEEE 802.3ae parallel scrambler can refer to the circuit shown in FIG. 3.

The XOR register 310 can be formed, for example, by integrating an XOR gate and a register, such as a flip-flop. It may also be formed according to the embodiment shown in FIG. 5.

Figure 5:
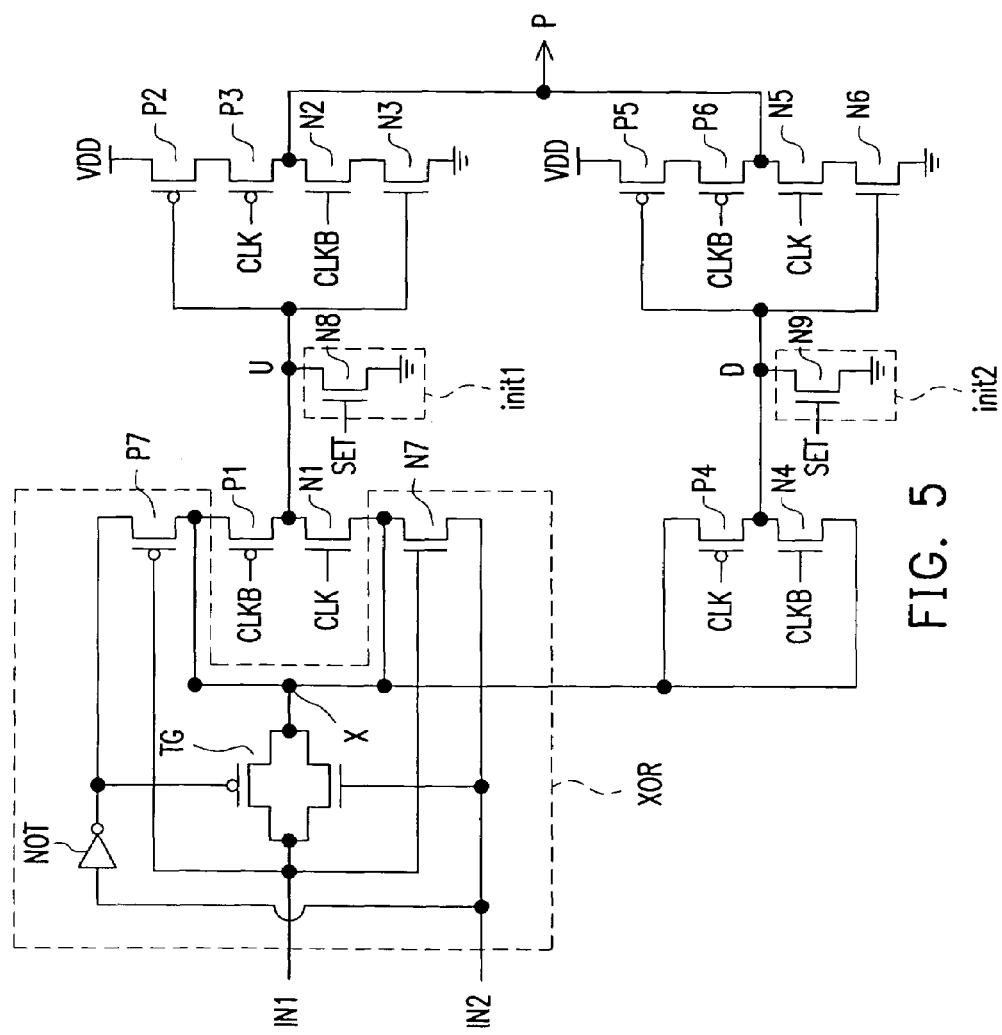
FIG. 5 is a circuit block diagram showing an XOR double-edge-triggered register according to an embodiment of the present invention.

In the structure of the scrambling code generator with high operational rate faster than 1 GHz, the delay time of the XOR gate is so long that the setup time and hold time are restricted. As a result, the operational rate of the circuit cannot be improved. In order to reduce the delay caused by the XOR gate, the logic function of the XOR gate should be integrated with the register. FIG. 5 is a circuit block diagram showing an XOR double-edge-triggered register according to an embodiment of the present invention. With reference to FIG. 5, by using the XOR double-edge-triggered register, output data will be triggered at either positive edge or negative edge. The data transmission rate is double of the clock rate. In another aspect, as the transmission rate of the register is very high, the clock rate only requires half of the data rate, but not as high as the data transmission rate.

With reference to FIG. 5, the XOR circuit receives a plurality of input signals, such as IN1 and IN2, and performs the XOR operation for generating the data X. The P-type transistors P2-P3 and the N-type transistors N2-N3 constitute a first-stage logic gate. The P-type transistors P5-P6 and the N-type transistors N5-N6 constitute a second-stage logic gate. In this embodiment, the clock signal CLKB is reverse to the clock signal CLK. During the positive edge of the clock signal CLK, the second-stage logic gate transmits the preset value at the node D, the first-stage logic gate is off, and the first data IN1 and IN2 after the XOR operation are stored at the node U, waiting for the next clock signal to be triggered. During the negative edge of the clock signal CLK, the first-stage logic gate transmits the value at the node U, the second-stage logic gate is off, and the second data IN1 and IN2 after the XOR operation are stored at the node D, waiting for the next clock signal to be triggered. By using the first-stage logic gate and the second-stage logic gate with different clock triggering to control the data and the timing of triggering the output data, the data can be output in either the positive edge or the negative edge operation. In this embodiment, the init1 and init2 set the initial conditions of the nodes U and D, respectively. With reference to FIG. 5, the init1 and init2 use the preset signal SET to control the N-type transistors N8-N9. When the preset signal SET=1, the nodes U and D are set as 0. Accordingly, the output data P is 1. It should be apparent to one of ordinary skill in the art that, the init1 and init2 can be replaced by P-type transistors connected to the system voltage. When the preset signal SET=0, the nodes U and D are set as 1. These modifications are also within the scope of the present invention.

In this embodiment, the XOR circuit comprises a transmission gate TG, a P-type transistor P7, an N-type transistor N7 and a complement gate NOT. A first connecting input of the transmission gate TG receives the input data IN1. A first connecting output passes the data X. The second gate receives the input data IN2. The first gate receives the data reverse to the input data IN2. The data reverse to the input data IN2 are provided by the complement gate NOT. A source of the transistor P7 is connected to the first gate of the transmission gate TG, a drain of the transistor P7 is connected to the first connecting output of the transmission gate TG, and a gate of the transistor P7 receives the input data IN1. A drain of the transistor N7 is connected to the first connecting output of the transmission gate TG, a source of the transistor N7 is connected to the second gate of the transmission gate TG, and a gate of the transistor N7 receives the input data IN1.

Accordingly, the parallelization rule and provides the structure for transforming the serial scrambler to parallel scrambler and develops the formula therefore. The parallel structure generates a plurality of clock triggered data, instead of a signal clock triggered data, to perform the parallel encoding operation and improve the operational rate of the circuit. By integrating the double-edge-triggered $C^2MOS$ register and XOR gate, the operational rate of the circuit is substantially enhanced. Most important of all, by integrating all features described above in the embedded XOR gate double-edge-triggered parallel scrambler, the circuit can operate with a high rate, such as 40 Gbps, or a even higher. Overall, the parallel scrambler resolves the rate limitation of the serial scrambler.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of transforming a serial scrambler to a parallel scrambler for transforming a serial scrambler to a parallel scrambler with M-bit output, the parallel scrambler comprising a plurality of XOR gates and registers, and an output of each of the XOR gates connected to an input of one of the registers, the serial scrambler having a characteristic polynomial:

$$P(x) = \sum_{q=0}^{N} c_q x^q,$$

wherein N represents a total stage of the registers of the serial scrambler, when an output terminal of a $q^{th}$-stage register is connected to the XOR gates, $c_q=1$ or $c_q=0$, the method of transforming the serial scrambler to the parallel scrambler comprising:

setting a transformation number R, wherein $R=2^t$, t is an integer equal to or larger than 0 and has an initial condition 0;

gaining a transformation formula $$b_{(kN+i)} = \sum_{q=1}^{N} c_q b_{((k-R)N+i+R(N-q))}$$

according to the characteristic polynomial to arrange parallel bits in the order of $B_j=[b_{Mj}, b_{Mj+1}, \ldots, b_{Mj+M-2}, b_{Mj+M-1}]$, wherein $b_{Mj+p}$ represents an output of a $p^{th}$ bit of a $j^{th}$ byte from the parallel scrambler, and $b^{Mj+p}$ is generated from an output of one of the registers, wherein k is a quotient of $$\frac{Mj+p}{N},$$

i is a remainder of $$\frac{Mj+p}{N},$$

j is an integer larger than or equal to 0, and p is an integer larger than or equal to 0 and smaller than M;

operating the transformation formula;

adding 1 to t in $R=2^t$ and re-counting the transformation formula when $(k-R)N+i+R(N-q)$ is larger than $Mj-1$; and determining a coupling relationship between the XOR gates and the registers according to a computed result from the transformation formula.

2. The method of transforming a serial scrambler to a parallel scrambler of claim 1, further comprising the step of setting initial conditions of $b_1$ to $b_N$.

3. The method of transforming a serial scrambler to a parallel scrambler of claim 2, wherein the initial condition of $b_1$ to $b_N$ is 1.

4. The method of transforming a serial scrambler to a parallel scrambler of claim 1, further comprising the step of determining a number of the register, comprising:

determining the number of the registers being M, when M is larger than $M_{min}$ and small than $M_{max}$, and R is larger than 1, wherein $$M_{max} = (N-D)R, M_{min} = \frac{(N+D) \cdot R}{2},$$

and D represents a difference between the maximum and the minimum of q when $c_q=1$;

determining the number of the registers being W when $M_{min}$ is larger than $M_{max}$; and determining the number of the registers being N when M is smaller than $M_{max}$ and R is equal to 1, if not, the number of the registers being W;

wherein when $2M > R' \cdot N$, $W = R' \cdot N$, if not, $W = [R' \cdot N - (R' \cdot N \mod M)]$, wherein $$R' = 2^{\lceil \log_2 \frac{M}{N-D} \rceil}.$$

5. The method of transforming a serial scrambler to a parallel scrambler of claim 1, wherein the number of the XOR gates is M.

6. A parallel scrambler, comprising:

a scrambling code generator for generating a parallel scrambling code, the scrambling code generator comprising a plurality of XOR registers, each of the XOR registers comprising a plurality of input and a scrambling output to separately operate an XOR computation for register signals received by the input to separately generate one bit corresponding to the parallel scrambling code; and a plurality of XOR gates, a first receiving terminal of each of the XOR gates connected to one of the scrambling output corresponding thereto, a second receiving terminal of each of the XOR gates receiving one bit corresponding to an original data, an output terminal of each of the XOR gates outputting one bit of a scrambled parallel data, wherein one of the XOR registers is an XOR double-edge-triggered register, which comprises;

an XOR circuit comprising a first input, a second input and an XOR output;

a first P-type transistor, a first source/drain of the first P-type transistor connected to the XOR output, a gate of the first P-type transistor connected to a first clock signal;

a second P-type transistor, a source of the second P-type transistor connected to a first voltage, a gate of the second P-type transistor connected to a second source/drain of the first P-type transistor;

a third P-type transistor, a source of the third P-type transistor connected to a drain of the second P-type transistor, a gate of the third P-type transistor connected to a second clock signal;

a fourth P-type transistor, a first source/drain of the fourth P-type transistor connected to the XOR output, a gate of the fourth P-type transistor connected to the second clock signal;

a fifth P-type transistor, a source of the fifth P-type transistor connected to the first voltage, a gate of the fifth P-type transistor connected to a second source/drain of the fourth P-type transistor;

a sixth P-type transistor, a source of the sixth P-type transistor connected a drain of the fifth P-type transistor, a gate of the sixth P-type transistor connected to the first clock signal;

a first N-type transistor, a first source/drain of the first N-type transistor connected to the second source/drain of the first P-type transistor, a second source/drain of the first N-type transistor connected to the XOR output, a gate of the first N-type transistor connected to the second clock signal;

a second N-type transistor, a drain of the second N-type transistor connected to the drain of the third P-type transistor, a gate of the second N-type transistor connected to the first clock signal;

a third N-type transistor, a drain of the third N-type transistor connected to a source of the second N-type transistor, a source of the third N-type transistor connected to a second voltage, a gate of the third N-type transistor connected to the second source/drain of the first P-type transistor;

a fourth N-type transistor, a first source/drain of the fourth N-type transistor connected to the second source/drain of the fourth P-type transistor, a second source/drain of the forth N-type transistor connected to the XOR output, a gate of the fourth N-type transistor connected to the first clock signal;

a fifth N-type transistor, a drain terminal of the fifth N-type transistor connected to the drain terminal of the sixth P-type transistor, a gate terminal of the fifth N-type transistor connected to the second clock signal; and a sixth N-type transistor, a drain of the sixth N-type transistor connected to a source of the fifth N-type transistor, a source of the sixth N-type transistor connected to the second voltage, a gate of the sixth N-type transistor connected to the second source/drain of the forth P-type transistor.

7. The parallel scrambler of claim 6, wherein the XOR circuit comprises:

a transmission gate comprising a first gate, a second gate, a first connecting input and a first connecting output, the first connecting input of the transmission gate being the first input, the first connecting output of the transmission gate being the output of the XOR circuit, the second gate of the transmission gate being the second input;

a seventh P-type transistor, a first source/drain of the seventh P-type transistor connected to the first gate of the transmission gate, the second source/drain of the seventh P-type transistor connected to the first connecting output of the transmission gate, a gate of the seventh P-type transistor connected to the first connecting input of the transmission gate;

a seventh N-type transistor, a first source/drain of the seventh N-type transistor connected to the first connecting output of the transmission gate, a second source/drain of the seventh N-type transistor connected to the second gate of the transmission gate, a gate of the seventh N-type transistor connected to the first connecting input of the transmission gate; and a NOT gate, an input of the NOT gate connected to the second gate of the transmission gate, an output of the NOT gate connected to the first gate of the transmission gate.

8. The parallel scrambler of claim 6, further comprising:
an eighth N-type transistor, a first source/drain of the eighth N-type transistor connected to the second source/drain of the first P-type transistor, a second source/drain of the eighth N-type transistor connected to the second voltage, a gate of the eighth N-type transistor connected to a preset signal; and
a ninth N-type transistor, a first source/drain of the ninth N-type transistor connected to the second source/drain of the fourth P-type transistor, a second source/drain of the ninth N-type transistor connected to the second voltage, a gate of the ninth N-type transistor connected to the preset signal.

9. The parallel scrambler of claim 6, further comprising:
an eighth P-type transistor, a first source/drain of the eighth P-type transistor connected to the second source/drain of the first P-type transistor, a second source/drain of the eighth P-type transistor connected to the first voltage, a gate of the eighth P-type transistor connected to a preset signal; and
a ninth P-type transistor, a first source/drain of the ninth P-type transistor connected to the second source/drain of the fourth P-type transistor, a second source/drain of the ninth P-type transistor connected to the first voltage, a gate of the ninth P-type transistor connected to the preset signal.

10. The parallel scrambler of claim 6, wherein the first clock signal is reverse to the second clock signal.

11. The parallel scrambler of claim 6, wherein the first voltage is a system source voltage.

12. The parallel scrambler of claim 6, wherein the second voltage is a ground voltage.

13. An XOR double-edge-triggered register, comprising:
an XOR circuit comprising a first input, a second input and an XOR output;
a first P-type transistor, a first source/drain of the first P-type transistor connected to the XOR output, a gate of the first P-type transistor connected to a first clock signal;
a second P-type transistor, a source of the second P-type transistor connected to a first voltage, a gate of the second P-type transistor connected to a second source/drain of the first P-type transistor;
a third P-type transistor, a source of the third P-type transistor connected to a drain of the second P-type transistor, a gate of the third P-type transistor connected to a second clock signal;
a fourth P-type transistor, a first source/drain of the fourth P-type transistor connected to the XOR output, a gate of the fourth P-type transistor connected to the second clock signal;
a fifth P-type transistor, a source of the fifth P-type transistor connected to the first voltage, a gate of the fifth P-type transistor connected to a second source/drain of the forth P-type transistor;
a sixth P-type transistor, a source of the sixth P-type transistor connected a drain of the fifth P-type transistor, a gate of the sixth P-type transistor connected to the first clock signal;
a first N-type transistor, a first source/drain of the first N-type transistor connected to the second source/drain of the first P-type transistor, a second source/drain of the first N-type transistor connected to the XOR output, a gate of the first N-type transistor connected to the second clock signal;
a second N-type transistor, a drain of the second N-type transistor connected to the drain of the third P-type transistor, a gate of the second N-type transistor connected to the first clock signal;
a third N-type transistor, a drain of the third N-type transistor connected to a source of the second N-type transistor, a source of the third N-type transistor connected to a second voltage, a gate of the third N-type transistor connected to the second source/drain of the first P-type transistor;
a fourth N-type transistor, a first source/drain of the fourth N-type transistor connected to the second source/drain of the fourth P-type transistor, a second source/drain of the fourth N-type transistor connected to the XOR output, a gate of the forth N-type transistor connected to the first clock signal;
a fifth N-type transistor, a drain of the fifth N-type transistor connected to the drain of the sixth P-type transistor, a gate of the fifth N-type transistor connected to the second clock signal; and
a sixth N-type transistor, a drain of the sixth N-type transistor connected to a source of the fifth N-type transistor, a source of the sixth N-type transistor connected to the second voltage, a gate of the sixth N-type transistor connected to the second source/drain of the fourth P-type transistor.

14. The XOR double-edge-triggered register of claim 13, wherein the XOR circuit comprises:
a transmission gate comprising a first gate, a second gate, a first connecting input and a second connecting input, the first connecting output of the transmission gate being the first output, the first connecting output of the transmission gate being the output of the XOR circuit, the second gate of the transmission gate being the second input;
a seventh P-type transistor, a first source/drain of the seventh P-type transistor connected to the first gate of the transmission gate, the second source/drain of the seventh P-type transistor connected to the first connecting output of the transmission gate, a gate of the seventh P-type transistor connected to the first connecting input of the transmission gate;
a seventh N-type transistor, a first source/drain of the seventh N-type transistor connected to the first connecting output of the transmission gate, a second source/drain of the seventh N-type transistor connected to the second gate of the transmission gate, a gate of the seventh N-type transistor connected to the first connecting input of the transmission gate; and a NOT gate, an input of the NOT gate connected to the second gate of the transmission gate, an output of the NOT gate connected to the first gate of the transmission gate.

15. The XOR double-edge-triggered register of claim 13, further comprising:
an eighth N-type transistor, a first source/drain of the eighth N-type transistor connected to the second source/drain of the first P-type transistor, a second source/drain of the eighth N-type transistor connected to the second voltage, a gate of the eighth N-type transistor connected to a preset signal; and
a ninth N-type transistor, a first source/drain of the ninth N-type transistor connected to the second source/drain of the fourth P-type transistor, a second source/drain of the ninth N-type transistor connected to the second voltage, a gate of the ninth N-type transistor connected to the preset signal.

16. The XOR double-edge-triggered register of claim 13, wherein the first clock signal is reverse to the second clock signal.

17. The XOR double-edge-triggered register of claim 13, wherein the first voltage is a system source voltage.

18. The XOR double-edge-triggered register of claim 13, wherein the second voltage is a ground voltage.

* * * * *